(12) United States Patent
Gardner et al.

(10) Patent No.: US 6,174,794 B1
(45) Date of Patent: Jan. 16, 2001

(54) METHOD OF MAKING HIGH PERFORMANCE MOSFET WITH POLISHED GATE AND SOURCE/DRAIN FEATURE

(75) Inventors: Mark I. Gardner, Cedar Creek; Mark C. Gilmer, Austin, both of TX (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/137,275

(22) Filed: Aug. 20, 1998

(51) Int. Cl.[7] ................................................. H01L 21/3205
(52) U.S. Cl. ........................... 438/595; 438/299; 438/303
(58) Field of Search .................................... 438/299, 303, 438/305, 306, 183, 595

(56) References Cited

U.S. PATENT DOCUMENTS

| | | | |
|---|---|---|---|
| 5,376,578 | * 12/1994 | Hsu et al. | 438/289 |
| 5,391,510 | * 2/1995 | Hsu et al. | 438/301 |
| 5,856,225 | * 1/1999 | Lee et al. | 438/291 |
| 5,960,270 | * 9/1999 | Misra et al. | 438/197 |
| 5,994,179 | * 11/1999 | Masuoka | 438/227 |

OTHER PUBLICATIONS

Stanley Wolf and Richard N. Tauber; Silicon Processing for the VLSI Era, vol. 2—Process Integration; pp. 144–152 and 238–239; 1990.

* cited by examiner

*Primary Examiner*—Charles Bowers
*Assistant Examiner*—Jack Chen
(74) *Attorney, Agent, or Firm*—Timothy M. Honeycutt (57) ABSTRACT

A transistor and a method of making the same are provided. The method includes the steps of forming a gate dielectric stack on the substrate that has a gate dielectric layer and forming first and second sidewall spacers adjacent the gate dielectric stack. A first portion of the gate dielectric stack is removed while a second portion thereof is left in place. First and second source/drain regions are formed in the substrate, and a conductor layer is formed over the first and second source/drain regions and on the second portion of the gate dielectric stack. The gate dielectric may be composed of a high dielectric constant material with a thin equivalent thickness of oxide. The method enables integrated processing of the gate electrode and source/drain metallization.

21 Claims, 6 Drawing Sheets

FIG. 12 ated with aluminum in early fabrication technologies. In conventional semiconductor fabrication processing, aluminum must be deposited following completion of all high temperature process steps (including anneal of the source and drain regions). As a result, an aluminum gate electrode must ordinarily be separately aligned to the source and drain. This alignment procedure can adversely affect both packing density and parasitic overlap capacitances between the gate and the source/drain regions. In contrast, polysilicon with its much higher melting point, can be deposited prior to source and drain formation and therefore provide for self-aligned gate processing. Furthermore, the high temperature capability of polysilicon is routinely exploited to enable interlevel dielectric layers to be applied to provide multiple metallization layers with improved planarity.

METHOD OF MAKING HIGH PERFORMANCE MOSFET WITH POLISHED GATE AND SOURCE/DRAIN FEATURE

BACKGROUND OF THE INVENTION

1. Field of the Invention

This invention relates generally to semiconductor processing, and more particularly, to an integrated circuit transistor with integrated gate electrode and source/drain metallization, and to a method of making the same.

2. Description of the Related Art

A typical field effect transistor implemented in silicon consists of a source and a drain formed in a silicon substrate, and separated laterally to define a channel region in the substrate. A gate electrode composed of a conducting material, such as aluminum or polysilicon, is disposed over the channel region and designed to emit an electric field into the channel region. Changes in the electric field emitted by the gate electrode enable, or alternatively, disable the flow of current between the source and the drain.

In a conventional process flow for forming a typical field effect transistor, a gate oxide layer is grown on a lightly doped silicon substrate and a layer of polysilicon is deposited on the gate oxide layer. The polysilicon layer is planarized to a desired thickness, frequently by chemical-mechanical-polishing ("CMP"), and both the polysilicon and the gate oxide are selectively etched back to the upper surface of the substrate, leaving a polysilicon gate electrode stacked on top of a gate oxide layer. Following formation of the polysilicon gate electrode, a source and a drain are formed by implanting a dopant species into the substrate. The gate electrode acts as a hard mask against the implant so that the source and drain are formed in the substrate self-aligned to the gate electrode. Many conventional semiconductor fabrication processes employ a double implant process to form the source and drain. The first implant is performed self-aligned to the gate electrode to establish lightly doped drain ("LDD") structures. After the LDD implant, dielectric sidewall spacers are formed adjacent to the gate electrode by depositing and anisotropically etching a dielectric material, such as silicon dioxide. The second of the two source/drain implants is then performed self-aligned to the sidewall spacers. The substrate is then annealed to activate the dopant in the source and the drain. Salicidation steps frequently follow the formation of the source and drain.

Early metal oxide semiconductor ("MOS") integrated circuit transistors were implemented as p-channel enhancement mode devices using aluminum as the gate electrode material. Aluminum was the material of choice due to its relatively low resistivity and material cost. Furthermore, there was already a large body of manufacturing experience with aluminum in the chip industry developed from bipolar integrated circuit processing.

A later process innovation that is still widely used today, involves the use of heavily doped polysilicon as a gate electrode material in place of aluminum. The switch to polysilicon as a gate electrode material was prompted by the recognition in the industry of certain disadvantages associated with aluminum in early fabrication technologies. In conventional semiconductor fabrication processing, aluminum must be deposited following completion of all high temperature process steps (including anneal of the source and drain regions). As a result, an aluminum gate electrode must ordinarily be separately aligned to the source and drain. This alignment procedure can adversely affect both packing Despite the several advantages of polysilicon over aluminum as a gate electrode material, polysilicon has the disadvantage of a much higher resistivity as compared to aluminum. Higher resistivity translates into higher values of interconnect line resistance that can lead to undesirably long RC time constants and DC voltage variations within VLSI or ULSI circuits. The development of polycide films on top of polysilicon layers has alleviated some of the resistivity shortcomings of polysilicon gate electrodes. However, the resistivity of polysilicon gate electrodes in conventional MOS integrated circuit processing still presents a potential impediment to successful process scaling through reductions in the operating voltages of VLSI and ULSI devices.

Another disadvantage of polysilicon as a gate electrode material is polysilicon depletion. In p-channel transistors, the source and drain are commonly formed in the substrate by implanting a p-type dopant, such as boron. The implant also deposits boron into the polysilicon of the gate electrode. Subsequent thermal processing steps to fabricate a conventional p-channel field effect transistor frequently cause boron to diffuse from the gate electrode through the gate oxide layer and into the channel region. If the amount of boron diffused is sufficiently high, the electrical performance of the field effect transistor may be severely degraded due to polysilicon depletion.

In addition to the drawbacks associated with conventional gate electrode manufacture, the gate dielectric formation aspects of conventional transistor fabrication present certain disadvantages. Silicon dioxide gate oxide layers are made as thin as possible to maximize drive current and to control short channel effects. The requirement for very thin gate oxide layers has become particularly important in submicron processing where process scaling has dramatically increased the potential for short channel effects. However, the scaling of silicon dioxide gate dielectric layers has introduced another set of problems. To begin with, very thin silicon dioxide layers have been historically difficult to fabricate with a consistent thickness across a given wafer, from wafer to wafer and from lot to lot. In addition, as the thickness of silicon dioxide is scaled downward, the potential for reliability problems associated with dielectric breakdown and hot-carrier-injection degradation increases. Hot carrier degradation can significantly reduce device performance, while dielectric breakdown can lead to complete device failure.

As noted above, salicidation ("self-aligned silicide formation") frequently follows source/drain formation in many conventional field effect transistor fabrication processes. The object of salicidation is to establish regions of increased conductivity over structures that are slated for interconnection with subsequently formed metallization layers. Source and drain regions and polysilicon gate electrodes are examples of such structures. The goal is to reduce the sheet resistance of the contacts to the source and drain regions and the gate electrode and to position a diffusion barrier over the silicon and polysilicon surfaces that might otherwise lead to conductor spike formation.

In a typical salicidation process, the substrate, including the gate electrode and sidewall spacers, are blanketed with a layer of silicide forming material, such as titanium. The substrate is then heated to initiate a reaction between the titanium and the silicon surfaces exposed to the titanium. These surfaces include the surfaces of the substrate on either side of the gate electrode, and the gate electrode itself, if composed of polysilicon or other silicide forming material. The reaction establishes a layer of titanium silicide over the source and drain regions and over the gate electrode, if composed of polysilicon. Any unreacted titanium is then removed by an etch process.

Metallization to the silicide is established by forming a dielectric layer over the silicide and opening contact holes in the dielectric layer down to the silicide layer by etching. A conducting material, frequently a metal, is then deposited over the dielectric layer and into the contact holes. The portion of the metal layer positioned above the holes is planarized, frequently by CMP.

One difficulty with the aforementioned conventional processes is the sheer number of separate process steps involved. For example, gate formation, silicide formation and silicide-metallization require at least two separate planarization steps, one for the gate deposition and one for the silicide-metallization deposition, and two to three conductor deposition steps, one each for the gate, the silicide and the silicide-metallization. Furthermore, where endpoint detection is less than optimal, the etch of the dielectric layer to form contact holes may damage the silicide layer, resulting in poor device performance.

The present invention is directed to overcoming or reducing the effects of one or more of the foregoing disadvantages.

SUMMARY OF THE INVENTION

In accordance with one aspect of the present invention, a method of fabricating a transistor on a substrate is provided. The method includes the steps of forming a gate dielectric stack on the substrate that has a gate dielectric layer, and forming first and second sidewall spacers adjacent the gate dielectric stack. A first portion of the gate dielectric stack is removed while a second portion thereof is left in place. First and second source/drain regions are formed in the substrate, and a conductor layer is formed over the first and second source/drain regions and on the second portion of the gate dielectric stack.

In accordance with another aspect of the present invention, a method of fabricating a transistor on a substrate is provided. The method includes the steps of forming a gate dielectric layer on the substrate, a first insulating layer on the gate dielectric layer and a second insulating layer on the first insulating layer. First and second sidewall spacers are formed adjacent the gate dielectric layer, the first insulating layer and the second insulating layer. The first and second insulating layers are removed and first and second source/drain regions are formed in the substrate. A conductor layer is formed over the first and second source/drain regions and on the gate dielectric layer.

In accordance with another aspect of the present invention, a transistor is provided. The transistor includes a substrate and a gate dielectric layer positioned on the substrate. First and second sidewall spacers are positioned adjacent the gate dielectric layer. First and second source/drain regions are positioned in the substrate in lateral separation to define a channel region beneath the gate dielectric layer. A conductor layer is provided that has a first portion positioned on the first source/drain region, a second portion positioned on the second source/drain region and a third portion positioned on the gate dielectric layer. The first, second and third portions are substantially planar with the first and second sidewall spacers such that the third portion is physically separated, respectively, from the first and second portions by the first and second sidewall spacers.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
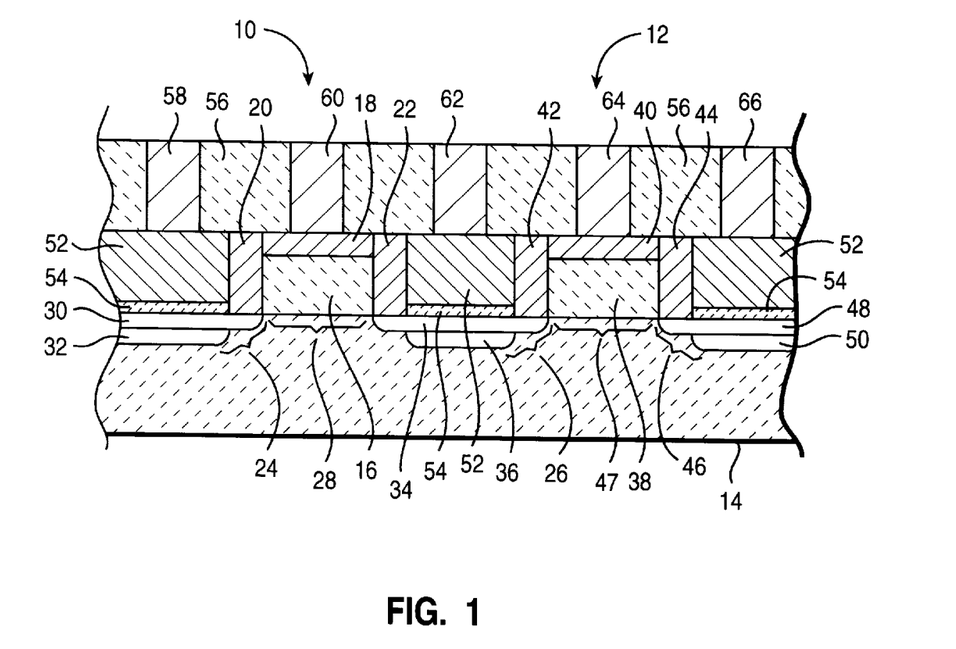
FIG. 1 is a cross sectional view of an exemplary embodiment of two integrated circuit transistors in accordance with the present invention.

In the drawings described below, reference numerals are generally repeated where identical elements appear in more than one figure. Turning now to the drawings, and in particular to FIG. 1, there is shown a cross-sectional view of an exemplary embodiments of integrated circuit transistors 10 and 12 that are formed on a semiconductor substrate 14. The semiconductor substrate 14 may be composed of n-doped, or p-doped silicon, silicon-on-insulator, or other suitable substrate materials. The transistor 10 includes an insulating or gate dielectric layer 16 that is formed on the substrate 14 and a gate electrode 18 that is formed on the first insulating layer 16. A pair of insulating sidewall spacers 20 and 22 are positioned adjacent the gate dielectric layer 16. First and second source/drain regions 24 and 26 are formed in the substrate 14 and separated laterally to define a channel region 28 in the substrate 14 beneath the gate electrode 16. The source/drain region 24 consists of a lightly doped drain ("LDD") structure 30 and an overlapping heavier doped region 32. The source/drain region 26 consists of like LDD and heavier doped structures and regions 34 and 36. The phrase "source/drain region(s)" is used herein to describe a region that may serve as either a source or a drain. The skilled artisan will appreciate that a source/drain region may function as a source or a drain depending upon whether it is connected to $V_{SS}$ or $V_{DD}$ during metallization.

The transistor 12 may be substantially identical to the transistor 10, and is, accordingly, provided with a gate dielectric layer 38, a gate electrode 40, and sidewall spacers 42 and 44. The transistor 12 shares the source/drain region 26 with the transistor 10 and is provided with an additional source/drain region 46 that is separated laterally in the substrate 14 from the source/drain region 24 to define a channel region 47 in the substrate 14 beneath the gate dielectric layer 38. Like the source/drain regions 24 and 26, the source drain region 46 consists of a LDD region 48 and an overlapping heavier doped region 50.

Metallization of the source/drain regions 24, 26 and 40 is provided via a conductor layer 52 that is positioned on the source/drain regions 24, 26 and 40. As discussed more below, the conductor layer 52 and the gate electrodes 18 and 40 are advantageously formed as an integral layer. Gate-to-source/drain shorting is prevented by subsequently planarizing the layer 52 along with the spacers 20 and 22 and 42 and 44, so that each portion of the layer 52 overlying a source/drain region, such as the source/drain region 24, is laterally separated from a proximate gate electrode(s); in this case, the gate electrode 18. Enhanced ohmic contact between the source/drain regions 24, 26 and 46 and the conductor layer 52 may be provided by interposing a silicide layer 54 between the conductor layer 52 and the substrate 14.

Where multi-level metallization is envisioned, the transistors 10 and 12 may be covered by an interlevel dielectric layer 56 through which vias are formed and filled with local interconnects in the form of contact plugs 58, 60, 62, 64, and 66. The plugs 58, 62 and 66 establish ohmic contact with, respectively, the portions of the conductor layer 52 overlying the source/drain regions 24, 26 and 46, while the plugs 60 and 64 provide ohmic contact with the gate electrodes 18 and 40.

Figure 2:
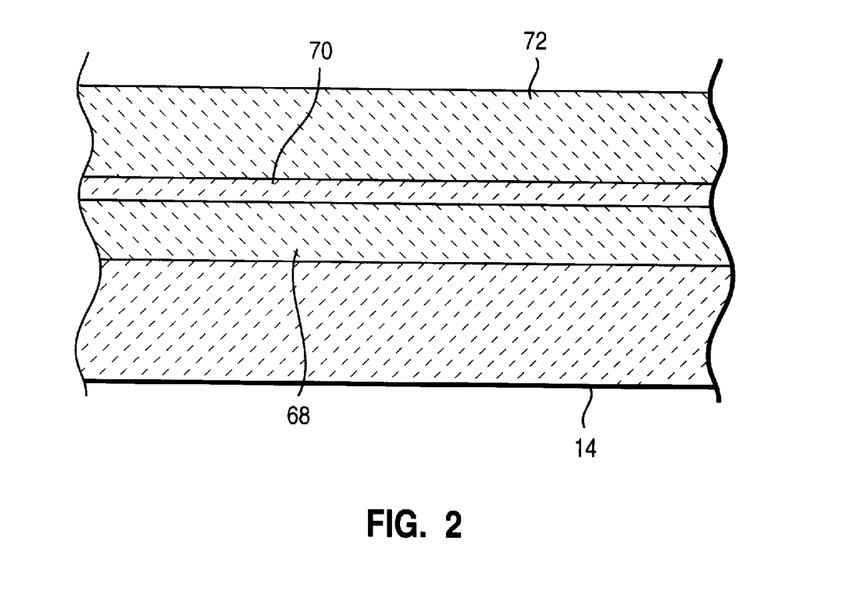
FIG. 2 is a cross sectional view of a substrate depicting formation of a gate dielectric stack in accordance with the present invention.

An exemplary process flow for forming the transistors 10 and 12 may be understood by referring now to FIGS. 2, 3, 4, 5, 6, 7 and 8, and initially to FIG. 2. The process will be described in the context of n-channel devices. However, the skilled artisan will appreciate that the transistors 10 and 12 may be implemented as n-channel, p-channel or another type of device. The skilled artisan will also appreciate that the process may be applied to a single or multiple transistors.

Initially, an insulating layer 68 is formed on the substrate 14 and subsequently covered with insulating layers 70 and 72. Through subsequent processing, and as described more fully below, the insulating layer 68 will be shaped into the gate dielectric layers 16 and 38 shown in FIG. 1. The insulating layer 68 may be composed of a conventional gate dielectric material, such as $SiO_2$, but is advantageously composed of a material with a relatively high permittivity or dielectric constant ("∈") that yields a relatively thin equivalent thickness of oxide ("$t_{ox}$") and exhibits resistance to dielectric breakdown and hot-carrier degradation. Exemplary materials include barium titanate ($BaTiO_3$), strontium titanate ($SrTiO_3$), $TiO_2$, $Ta_2O_5$, or like materials. In an exemplary embodiment, the layer 68 is $BaTiO_3$ and may be formed by depositing a conformal layer of barium and titanium on the substrate 14. The deposition may be via chemical vapor deposition ("CVD"), sputter or other like techniques.

The layer of barium-titanium is then converted to $BaTiO_3$ by annealing in an oxygen containing ambient. The anneal may be conducted under a variety of conditions. For example, a rapid thermal anneal ("RTA") may be conducted with an ambient of about 50% $O_2$ and a like percentage of an inert gas, such as argon, at about 850 to 1050° C. for about 15 to 30 seconds. The concentration of the inert gas, such as argon, may be varied to control the oxidation rate of the barium-titanium to a desired level. Alternatively, the anneal may be accomplished in a diffusion tube furnace process at about 700 to 800° C. for about 15 minutes.

The mathematical relationship between the targeted equivalent $t_{ox}$ for the layer 68 and the actual thickness of the $BaTiO_3$ layer 68 is given by the following equation:

$$\frac{\varepsilon_{BaTiO_3}}{\varepsilon_{SiO_2}} \cdot (\text{Equivalent } t_{ox}) \cong (\text{Thickness of } BaTiO_3 \text{ Layer}) \quad \text{Equation 1}$$

where $\varepsilon_{BaTiO_3}$ and $\varepsilon_{SiO_2}$ are the dielectric constants for $BaTiO_3$ and $SiO_2$. Note that the equation is expressed as an approximation since both $BaTiO_3$ and $SiO_2$ are isotropic materials with a range of dielectric constants instead of a single value. Furthermore, the range or single value of ∈ for a given material is also dependent upon measurement conditions, e.g., constant strain or unclamped, temperature and frequency. For example, $BaTiO_3$ has a constant strain dielectric constant $\varepsilon_{BaTiO_3}$ that may range from about 80 to 2300 at 298° K and 2.5E8 Hz. Similarly, $SrTiO_3$ has a constant strain dielectric constant that may range from about 332 at 298° K and 1.0E3 Hz to 2080 at 78° K and 1.0E3 Hz.

A desirable $t_{ox}$ of about 5 to 30 Å is yielded by a $BaTiO_3$ layer 68 ($\varepsilon_{BaTiO_3}$ of 80) with a thickness of about 87 to 437 Å. The subsequently patterned gate dielectric layers 16 and 38 formed from the layer 68 exhibit not only a very thin equivalent $t_{ox}$, but also better resistance to dielectric breakdown and hot-carrier degradation than conventional gate oxide.

The application of the layer 68 has been described in the context of metal deposition followed by oxidation. However, the skilled artisan will appreciate that other techniques may be used. For example, the layer 68 may be applied as an oxide, e.g., $BaTiO_3$, by CVD, sputter or like techniques.

Still referring to FIG. 2, the insulating layer 72 provides a temporary structure above the insulating layer 68 to facilitate later formation of the sidewall spacers 20, 22, 42 and 44. In later processing, the layer 72 is etched away with the insulating layer 70 providing an etch stop to protect the underlying insulating layer 68. The insulating layer 72 may be composed of a variety of materials, such as $SiO_2$, $Si_3N_4$, the aforementioned high e materials or the like. In an exemplary embodiment, the layer 72 is composed of $BaTiO_3$, and may be applied via the aforementioned deposition technique. To provide the desired etch stop characteristic, the layer 72 and the layer 70 are preferably dissimilar materials where the material for the layer 72 is resistant to an etch to remove the layer 72. Materials such as $Si_3N_4$, $SiO_2$ or the like may be appropriate. In an exemplary embodiment, the layer is composed of $Si_3N_4$.

The desired thickness of the layer 72 will depend upon the desired overall thickness of the layer 68, the layer 70 and the layer 72 and the desired thickness of the layer 68. The combined thickness of the layers 68, 70 and 72 should be large enough to provide a tall enough structure to enable subsequent formation of the spacers 20, 22, 42 and 44 with an appropriate height. In an exemplary embodiment, the combined thickness of the layer 68, the layer 70 and the layer 72 may be about 1000 to 3000 Å, and is advantageously about 2000 Å. The layer 70 may be relatively thin, on the order of about 5 to 20 Å. Assuming for the purpose of this illustration that the layer 68 has a thickness of about 87 to 434 Å, the layer 70 may have a thickness of about 908 to 2546 Å, and advantageously about 1727 Å.

Figure 3:
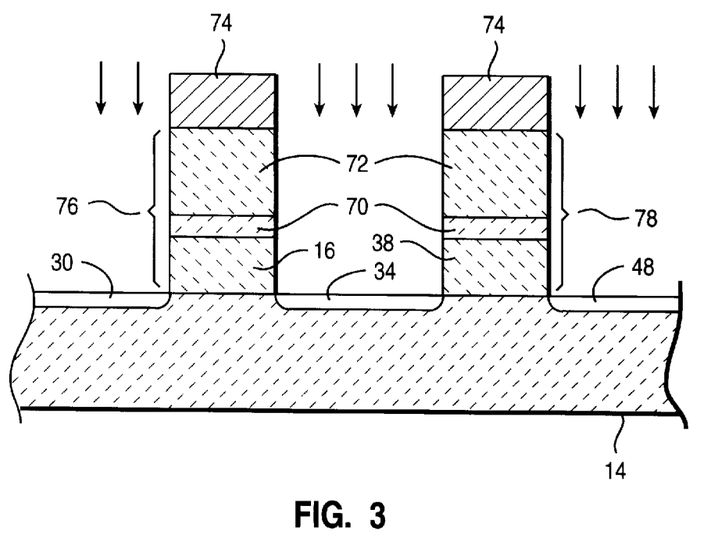
FIG. 3 is a cross sectional view like FIG. 2 depicting etch definition of two gate dielectric stacks and establishment of LDD regions in accordance with the present invention.

Referring now to FIGS. 2 and 3, the insulating layer 72 is masked with photoresist 74 and the photoresist 74 is patterned, i.e., exposed and developed, leaving two portions of the layer 72 masked. An anisotropic etch removes the unmasked portions of the layers 72, 70 and 68 and defines gate dielectric stacks 76 and 78. The etch of the insulating layer 68 leaves the gate dielectric layers 16 and 38 as the respective bases of the stacks 76 and 78, with the unetched portions of the layers 70 and 72 constituting the remainders of the stacks 76 and 78. The etch may be by reactive ion etching ("RIE"), plasma etching or the like.

Following definition of the gate dielectric stacks 76 and 78, the LDD regions 30, 34 and 48 are established in the upper region of the substrate 14 by introducing a dopant specie therein. The dopant specie may be introduced by ion implantation or diffusion as desired. In an exemplary embodiment, the LDD regions 30, 34 and 48 are formed by implanting an n-type dopant, such as arsenic. The dosage may be about 5E13 to 2E15 ions/cm$^2$ and is advantageously about 1E15 ions/cm$^2$. The energy may be about 5 to 20 keV and is advantageously about 15 keV. The implant angle is advantageously 0°. As the skilled artisan will appreciate, the energy and dosage of the implant will depend upon the dopant specie.

Figure 4:
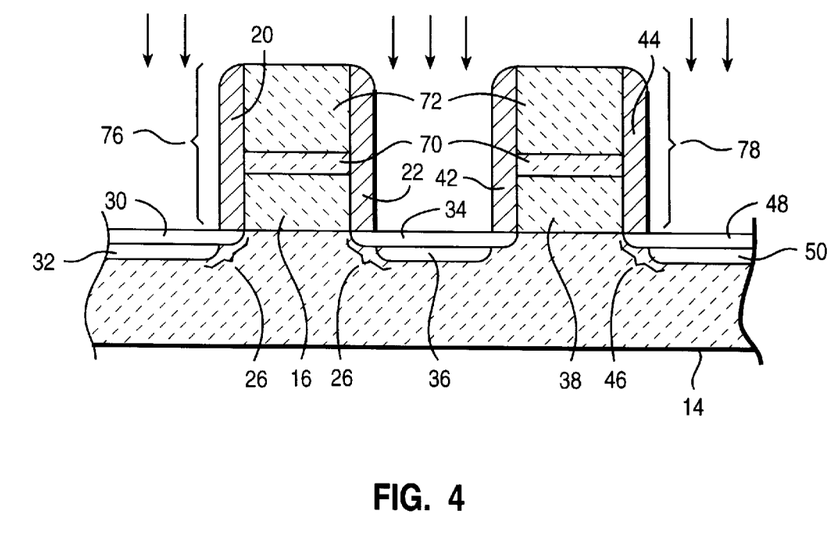
FIG. 4 is a cross sectional view like FIG. 3 depicting formation of sidewall spacers and heavier doped drain regions in accordance with the present invention.

Referring now to FIGS. 3 and 4, the photoresist 74 is stripped and the dielectric sidewall spacers 20, 22, 42 and 44 are formed. The spacers 20, 22, 42 and 44 may be composed of a suitable sidewall spacer material, such as, for example, SiO$_2$, Si$_3$N$_4$, or similar suitable sidewall spacer materials. The spacers 20, 22, 42 and 44 may be fabricated by forming a conformal layer of the selected material by oxidation, CVD, or other technique, followed by anisotropic etching to leave the spacers 20 and 22 and 42 and 44 respectively positioned adjacent the gate dielectric stacks 76 and 78. The spacers 20, 22, 42 and 44 are advantageously composed of Si$_3$N$_4$, may be 200 to 800 Å wide and are advantageously about 500 Å wide. The gate dielectric stacks 76 and 78 provide vertical structures against which the conformal layer of Si$_3$N$_4$ adheres prior to etch definition of the spacers 20, 22, 42 and 44.

Following formation of the spacers 20, 22, 42 and 44, the heavier doped regions 32, 36 and 50 of the source/drain regions 24, 26 and 46 are established by introducing a dopant of the same conductivity type, e.g., n-type, into the substrate 14. Like the aforementioned LDD regions 30, 34 and 48, the heavier doped regions are advantageously established by ion implantation. The dosage may be about 2E13 to 1E16 ions/cm$^2$ and is advantageously about 5E15 ions/cm$^2$. The energy may be about 5 to 30 keV and is advantageously about 20 keV. The implant angle is advantageously 0°. As the skilled artisan will appreciate, the energy and dosage of the implant will depend upon the dopant specie.

The formation of the source/drain regions 24, 26 and 46 has been described in the context of a double implant process to establish combined LDD and heavier doped regions. However, the regions 24, 26 and 46 may be formed without LDD regions if desired.

Figure 5:
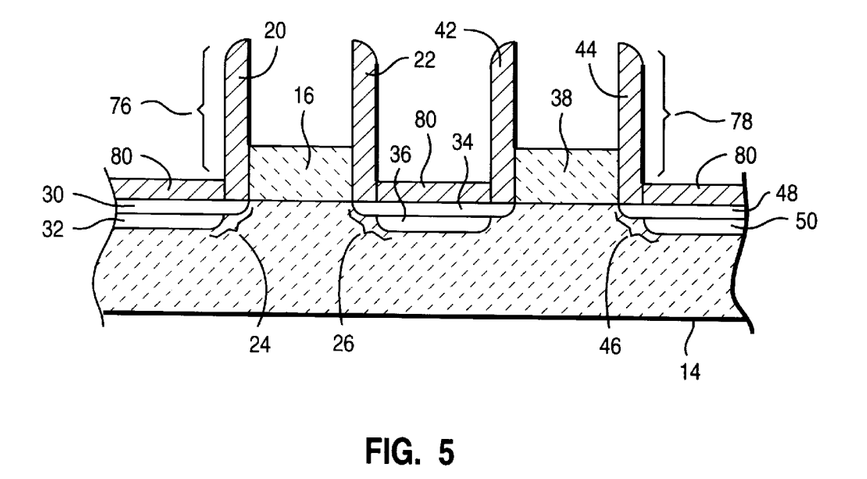
FIG. 5 is a cross sectional view like FIG. 4 depicting removal of portions of the gate dielectric stacks in accordance with the present invention.

At this point in the process flow, the insulating layers 72 and 70 have served the intended purpose of providing temporary vertical structures to facilitate formation of the spacers 20, 22, 42 and 44, and are now sacrificed. As illustrated in FIGS. 4 and 5, portions of the gate dielectric stacks 76 and 78 consisting of the insulating layers 72 and 70 are removed by etching while the gate dielectric layers 16 and 38 are left intact. The etch may be via plasma etch, RIE, a dip or the like, with well known etch chemistries appropriate for the BaTiO$_3$ and Si$_3$N$_4$ layers 72 and 70 or other materials as the case may be. Prior to the etch, a thin oxide layer 80 is formed on the substrate 14 to protect the substrate 14 during the etching of the layers 72 and 70. The layer 80 is advantageously formed by thermal oxidation of the substrate. For example, the oxidation may be accomplished by exposing the substrate to an oxygen containing ambient at about 800 to 1050° C. for about 10 to 30 seconds in a rapid thermal anneal ("RTA") process. The layer 80 may be about 50 to 150 Å thick. The layer 80 is etched away following the etching of the layers 72 and 70. A variety of well known silicon dioxide etch process may be used. However, care should be taken to avoid significantly attacking the gate dielectric layers 16 and 38.

The high temperature thermal oxidation step to form the layer 80 may serve to anneal and activate the source/drain regions 24, 26 and 46. If desired, a separate anneal step may be performed at about 700 to 850° C. for about 5 to 15 seconds in a RTA or about 5 to 15 minutes in a furnace process.

Figure 6:
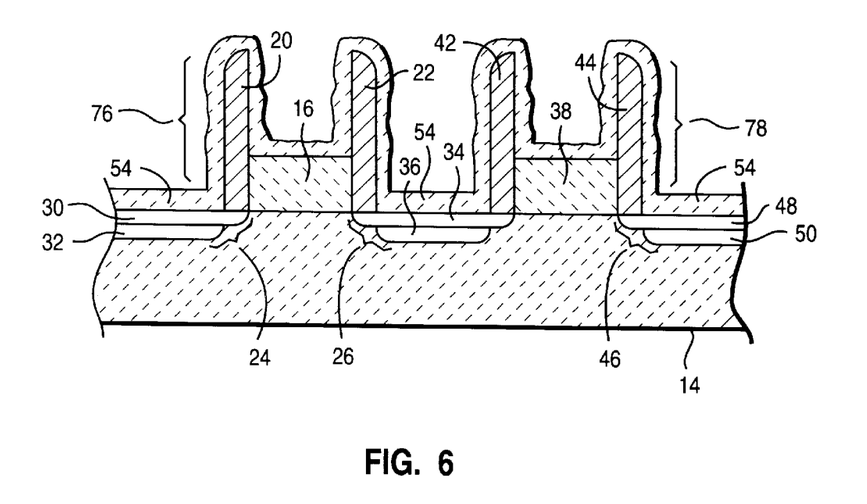
FIG. 6 is a cross sectional view like FIG. 5 depicting application of a silicide forming layer on the substrate in accordance with the present invention.
Figure 7:
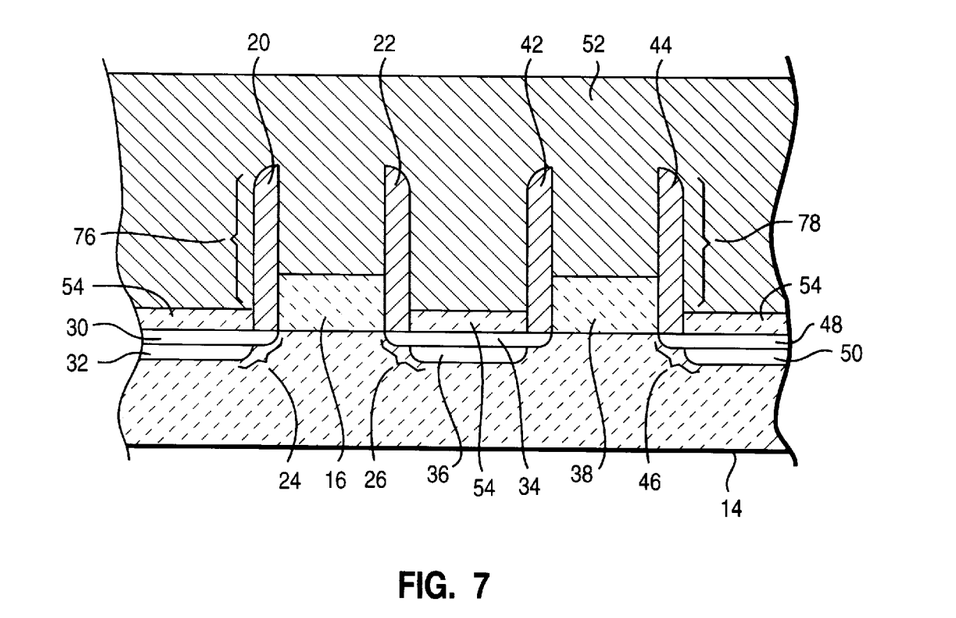
FIG. 7 is a cross sectional view like FIG. 6 depicting formation of a conductor layer over the source/drain regions and the remaining portions of the gate dielectric stacks in accordance with the present invention.

Referring now to FIG. 6, the silicide layer 54 may be formed by depositing a silicide forming material, such as titanium, cobalt or like materials on the substrate 14, and heating the material to initiate a silicide forming reaction. The material may be annealed in an inert ambient at approximately 650 to 700° C. for approximately 30 to 60 seconds in a RTA. As shown in FIG. 7, the substrate 14 is subjected to RCA cleaning to remove any unreacted metal and leave the silicide layer 54 positioned over the source/drain regions 24, 26 and 46. A final anneal is performed at approximately 700 to 800° C. for approximately 30 to 60 seconds to stabilize the silicide. The resulting silicide layer 54 may have a thickness of about 250 to 500 Å and advantageously about 375 Å.

Figure 8:
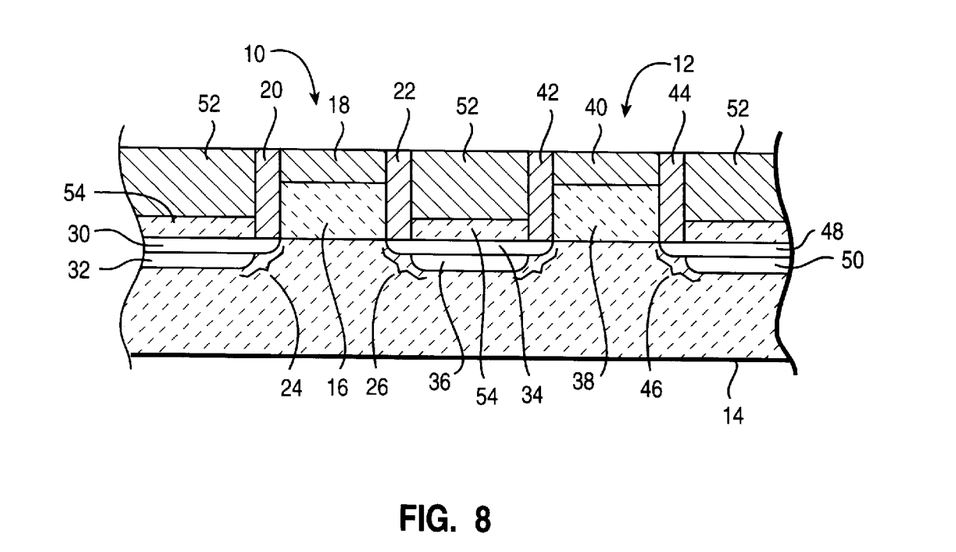
FIG. 8 is a cross sectional view like FIG. 7 depicting planarization of the conductor layer in accordance with the present invention.

Referring now to FIGS. 7 and 8, the conductor layer 52 is formed over the source/drain regions 24, 26 and 46 and the remaining portions of the gate dielectric stacks 76 and 78, that is, the gate dielectric layers 16 and 38. The formation of the conductor layer 52 simultaneously establishes metallization for the source/drain regions 24, 26 and 46 and conducting material on the gate dielectric layers 16 and 38. As shown in FIG. 8, the portions of the conductor layer 52 overlying the gate dielectric layers 16 and 38 will serve as the gate electrodes 18 and 40 following a subsequent planarization step which segregates the portions overlying the source/drain regions 24, 26 and 46 from the portions overlying the gate dielectric layers 16 and 38. A variety of conducting materials may be used to form the conductor layer 52, such as polysilicon, tantalum, tungsten, titanium or like materials. However, the process of the present invention enables the use of lower melting point materials to be used for the conductor layer 52 since the various high temperature steps associated with the formation of the spacers 20, 22, 42 and 44 and the source/drain regions 24, 26 and 46 are advanced ahead of the process of forming the gate electrodes 18 and 40 in the process flow. Accordingly, the conductor layer 52 may be fabricated from materials, such as aluminum, copper, alloys of the two or the like.

In an exemplary embodiment, the conductor layer 52 is composed of tungsten and may be deposited by CVD in a silane reduction process or other suitable tungsten deposition process. If desired, an adhesion layer (not shown for simplicity of illustration) of titanium nitride or other suitable material may be interposed between the tungsten layer 52 and the upper surfaces of the gate dielectric layers 16 and 38 and the opposing surfaces of the sets of spacers 20 and 22 and 42 and 44. A tungsten gate electrode 16 has the advantages of resistance to high temperature degradation and the elimination of polysilicon depletion that is frequently associated with polysilicon gate electrodes in p-channel devices. Accordingly, a tungsten gate electrode 16 enables greater flexibility in the thermal budgeting of the overall process flow.

Still referring to FIG. 8, the conductor layer 52 is planarized following initial deposition to yield the completed transistors 10 and 12. The layer 52 is planarized until the tops of the spacers 20 and 22 segregate the portions of the conductor layer 52 overlying the source/drain regions 24 and 26 from the now established gate electrode 18, and the tops of the spacers 42 and 44 segregate the portions of the conductor layer 52 overlying the source/regions 26 and 46 from the now established gate electrode 40. It is anticipated that the planarization process will reduce the height of the spacers 20, 22, 42 and 44. The planarization may be by chemical mechanical polishing ("CMP"), by etchback planarization, or other suitable planarization techniques.

Referring again to FIG. 1, the interlevel dielectric layer 56 is formed on the substrate 12. The layer 56 may be composed of silicon dioxide, tetra-ethyl-ortho-silicate ("TEOS"), or other suitable interlevel dielectric materials. If TEOS is selected, the layer 56 may be formed by CVD or like techniques. The interlevel dielectric layer 56 may be about 0.75 $\mu$m to 1.2 $\mu$m thick and is advantageously about 1.0 $\mu$m thick. Following deposition, the layer 56 is planarized to the desired thickness by CMP or other planarization techniques.

The contact plugs 58, 60, 62, 64 and 66 are formed by etching openings through the interlevel dielectric layer 56 and depositing a conducting material therein. The plugs 58, 60, 62, 64 and 66 may be composed of tungsten, polysilicon, aluminum, or other suitable conducting materials. In an exemplary embodiment, the plugs 58, 60, 62, 64 and 66 are advantageously composed of tungsten and may be deposited by CVD using the same or a similar type of silane reduction reaction used to deposit the gate electrode 16. Each of the plugs 58, 60, 62, 64 and 66 will normally be lined with an adhesion layer of the type described above, but not shown for simplicity of illustration.

Figure 9:
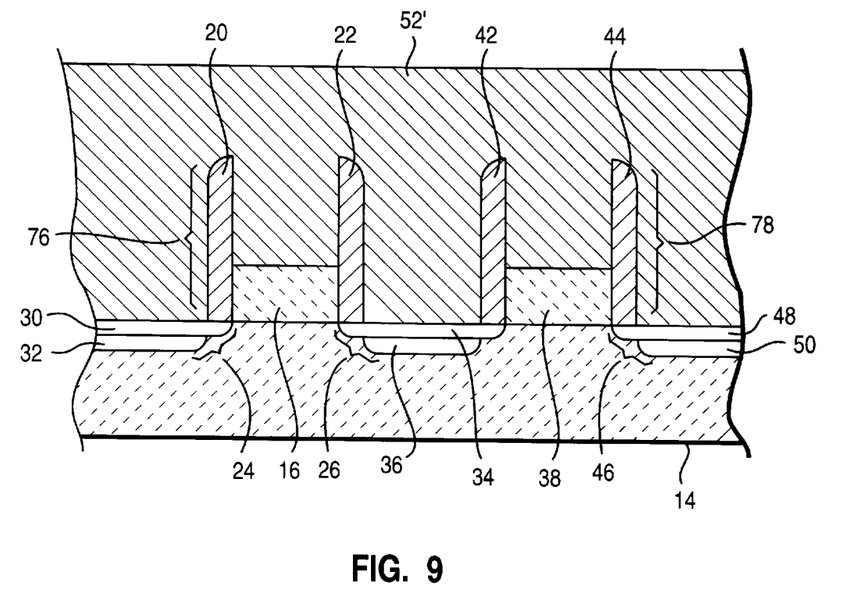
FIG. 9 is a cross sectional view like FIG. 8, but depicts an alternate exemplary process flow for forming the conductor layer in accordance with the present invention.
Figure 10:
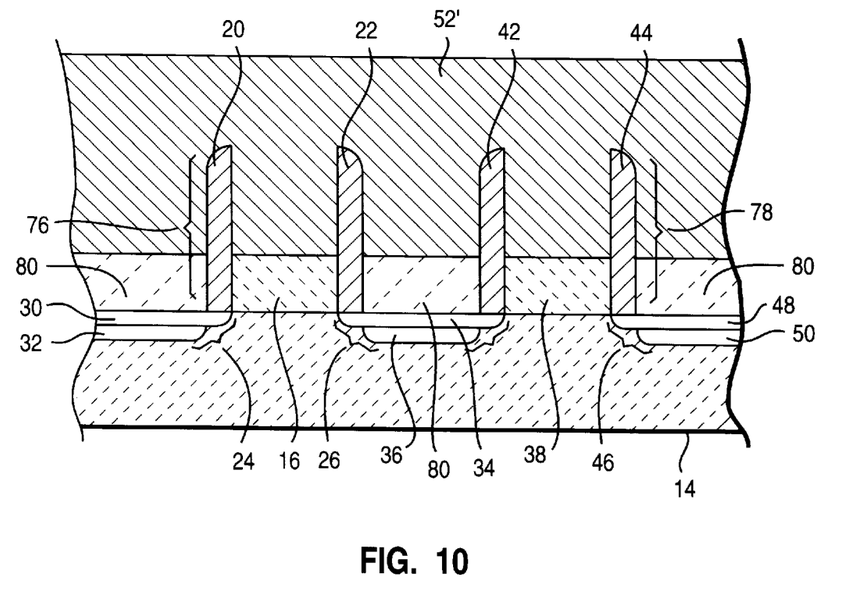
FIG. 10 is a cross sectional view like FIG. 9 depicting conversion of a portion of the conductor layer to silicide in accordance with the present invention.
Figure 11:
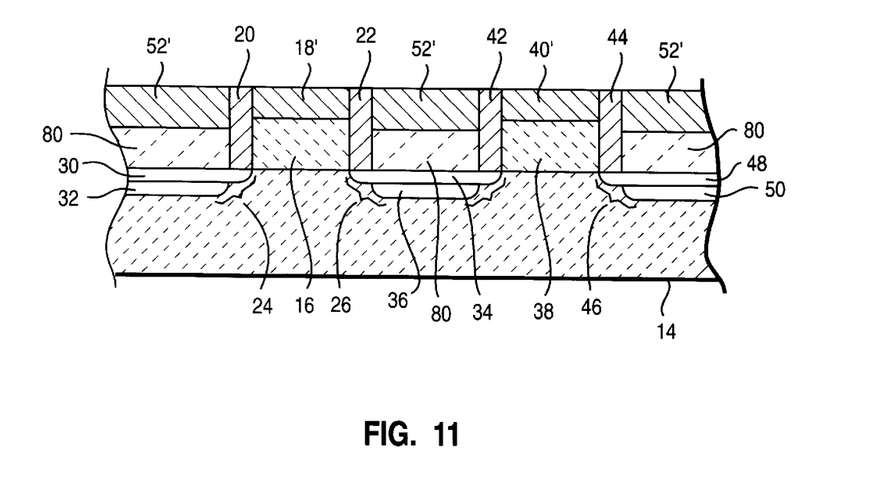
FIG. 11 is a cross sectional view like FIG. 10 depicting planarization of the conductor layer in accordance with the present invention.

An alternate exemplary process flow in accordance with the present invention may be understood by referring now to FIGS. 9, 10 and 11. FIG. 9 is a cross-sectional view like FIG. 6. In this alternate embodiment, the gate dielectric stacks 76 and 78 are processed as generally described above in relation to the process flow depicted in FIGS. 2–5. In this embodiment, the conductor layer, now designated 52', is deposited as a thick layer of silicide forming material, such as titanium, cobalt, or the like. The deposited silicide forming material conformally coats the substrate 14 as well as the gate dielectric layers 16 and 38. As shown in FIG. 10, the silicide forming material 52' is then heated to initiate a silicide forming reaction. The portions 80 of the conductor layer 52' proximate the substrate 14 will convert to silicide while the upper regions of the conductor layer 52' and the portions of the conductor layer 52' positioned between the sidewall spacers 20 and 22 and 42 and 44 will remain as unreacted metal. In this way, salicidation and metallization of the source/drain regions 24, 26 and 46 as well as the establishment of conducting material for the gate electrodes, now designated 18' and 40', are established in a single deposition step. Referring now to FIG. 11, the conductor layer 52' is planarized as described above in relation to FIG. 8 to leave the gate electrodes 18' and 40' segregated from the portions of the conductor layer 52' positioned over the source/drain regions 24, 26 and 46. The gate electrodes 18' and 40', as well as the upper regions of the conductor layer 52' are composed of the silicide forming metal, such as titanium, while the underlying portions 80 of the conductor layer 52 are composed of silicide.

Figure 12:
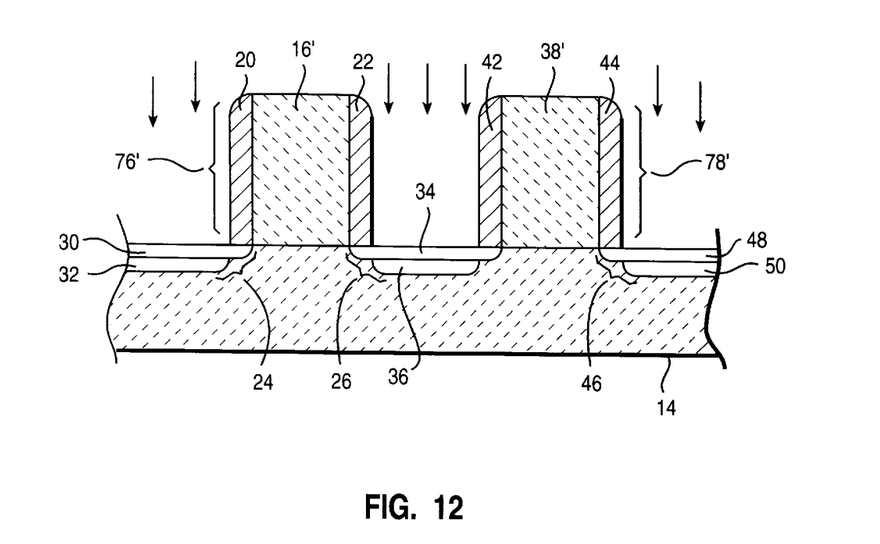
FIG. 12 is a cross sectional view like FIG. 4, but depicts an alternate exemplary process flow for forming the gate dielectric stacks in accordance with the present invention.

Another alternate exemplary process flow for fabricating the transistors in accordance with the present invention may be understood by referring now to FIG. 12, which is a cross sectional view like FIG. 4. The processing proceeds as described above generally in relation to FIGS. 1–4, including the formation of the spacers 20, 22, 42 and 44 and the source/drain regions 24, 26 and 46, with a notable exception. Whereas the gate dielectric stacks 76 and 78 depicted in FIGS. 2–4 each consist of insulating layers 70 and 72 positioned on a gate dielectric layer, either 16 or 18, the gate dielectric stacks, now designated 76' and 78', in this alternate process flow consist of a single layer of gate dielectric material, now designated 16' and 38'. The materials used to form the gate dielectric layers 16' and 38' may be as described above in relation to the process flow depicted in FIGS. 1–8. The layers 16' and 38' may then be etched to yield gate dielectric layers as generally depicted in FIG. 5, albeit with different numerical designations, namely 16 and 38. The process flow may then proceed as generally described above in relation to FIGS. 5–8 or 9–11.

The aforementioned exemplary process flows yield a transistor with a relatively high dielectric constant gate dielectric layer that has a correspondingly thin equivalent thickness of oxide and an integration of source/drain region metallization and gate electrode formation. High temperature steps associated with source/drain region and sidewall spacer formation are moved ahead of gate electrode formation in the process flow, enabling lower melting point materials to be used for the gate electrode and improving the overall flexibility of the thermal budget for the process.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a transistor on a substrate, comprising the steps of:

forming a gate dielectric stack on the substrate having a gate dielectric layer positioned on the substrate and an insulating structure positioned on the gate dielectric layer;

forming first and second sidewall spacers adjacent to the gate dielectric stack;

removing the insulating structure of the gate dielectric stack while leaving the gate dielectric layer after forming the first and second sidewall spacers;

forming first and second source/drain regions in the substrate; and forming a conductor layer simultaneously over the first and second source/drain regions to form first and second contact structures in respective ohmic contact with said first and second source/drain regions and on the gate dielectric layer to form a gate directly on the gate dielectric layer.

2. The method of claim 1, wherein the gate dielectric layer comprises a material having a dielectric constant greater than that of silicon dioxide.

3. The method of claim 2, wherein the material is $BaTiO_3$, $SrTiO_3$, $TiO_2$, or $Ta_2O_5$.

4. The method of claim 1, wherein the insulating structure is formed by forming a first insulating layer on the gate dielectric layer and a second insulating layer on the first insulating layer.

5. The method of claim 4, wherein the first insulating layer comprises silicon nitride.

6. The method of claim 5, wherein the second insulating layer comprises a material and the gate dielectric layer comprises the material.

7. The method of claim 1, wherein the step of forming first and second sidewall spacers comprises the steps of coating the gate dielectric stack and substrate with silicon nitride, and etching the silicon nitride to expose the substrate and the insulating structure.

8. The method of claim 1, wherein the step of forming first and second source/drain regions comprises the step of implanting a dopant specie into the substrate.

9. The method of claim 1, wherein the step of forming first and second source/drain regions comprises the steps of performing a first implant of a dopant specie into the substrate prior to formation of the first and second sidewall spacers and a second implant of a dopant specie in the substrate after formation of the first and second sidewall spacers, the dopant species of the first and second implants being of an identical conductivity type.

10. The method of claim 1, wherein the step of forming the conductor layer comprises the steps of depositing a layer of conducting material over the first and second source/drain regions and the gate dielectric stack and planarizing the layer of conducting material until the first and second spacers separate a portion of the layer of conducting material positioned over portion of the gate dielectric stack from portions of the layer of conducting material positioned over the first and second source/drain regions.

11. The method of claim 10, wherein the step of planarization comprises chemical mechanical polishing.

12. A method of fabricating a transistor on a substrate, comprising the steps of:

forming a gate dielectric layer on the substrate, a first insulating layer on the gate dielectric layer and a second insulating layer on the first insulating layer;

forming first and second sidewall spacers adjacent to the gate dielectric layer, the first insulating layer and the second insulating layer;

removing the first and second insulating layers;

forming first and second source/drain regions in the substrate; and forming a conductor layer simultaneously over the first and second source/drain regions to form first and second contact structures in respective ohmic contact with said first and second source/drain regions and on the gate dielectric layer to form a gate directly on the gate dielectric layer.

13. The method of claim 12, wherein the gate dielectric layer comprises a material having a dielectric constant greater than that of silicon dioxide.

14. The method of claim 13, wherein the material is $BaTiO_3$, $SrTiO_3$, $TiO_2$, or $Ta_2O_5$.

15. The method of claim 12, wherein the first insulating layer comprises silicon nitride.

16. The method of claim 14, wherein the second insulating layer comprises a material and the gate dielectric layer comprises the material.

17. The method of claim 12, wherein the step of forming first and second sidewall spacers comprises the steps of coating the gate dielectric layer, the first insulating layer, the second insulating layer and the substrate with silicon nitride, and etching the silicon nitride to expose the substrate and the second insulating layer.

18. The method of claim 12, wherein the step of forming first and second source/drain regions comprises the step of implanting a dopant specie into the substrate.

19. The method of claim 12, wherein the step of forming first and second source/drain regions comprises the steps of performing a first implant of a dopant specie into the substrate prior to formation of the first and second sidewall spacers and a second implant of a dopant specie in the substrate after formation of the first and second sidewall spacers, the dopant species of the first and second implants being of an identical conductivity type.

20. The method of claim 12, wherein the step of forming the conductor layer comprises the steps of depositing a layer of conducting material over the first and second source/drain regions and the second insulating layer and planarizing the layer of conducting material until the first and second spacers separate a portion of the layer of conducting material positioned over the second insulating layer from portions of the layer of conducting material positioned over the first and second source/drain regions.

21. The method of claim 12, wherein the step of planarization comprises chemical mechanical polishing.

* * * * *